(12) United States Patent
Van Gompel et al.

(10) Patent No.: US 9,989,235 B2
(45) Date of Patent: Jun. 5, 2018

(54) LED MODULE AND LUMINAIRE COMPRISING SAID MODULE

(71) Applicant: PHILIPS LIGHTING HOLDING B.V., Eindhoven (NL)

(72) Inventors: Waltherus Emericus Johannes Van Gompel, Eersel (NL); Winand Hendrik Anna Maria Friederichs, Elsloo (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 223 days.

(21) Appl. No.: 14/373,971

(22) PCT Filed: Jan. 17, 2013

(86) PCT No.: PCT/IB2013/050423
§ 371 (c)(1),
(2) Date: Jul. 23, 2014

(87) PCT Pub. No.: WO2013/111037
PCT Pub. Date: Aug. 1, 2013

(65) Prior Publication Data
US 2015/0036362 A1    Feb. 5, 2015

Related U.S. Application Data

(60) Provisional application No. 61/590,351, filed on Jan. 25, 2012.

(51) Int. Cl.
*F21V 19/00* (2006.01)
*F21V 29/70* (2015.01)
(Continued)

(52) U.S. Cl.
CPC .......... *F21V 29/70* (2015.01); *F21V 17/101* (2013.01); *F21V 17/12* (2013.01); *F21V 19/005* (2013.01);
(Continued)

(58) Field of Classification Search
CPC ..... F21V 29/70; F21V 17/101; F21V 19/0055
See application file for complete search history.

(56) References Cited

U.S. PATENT DOCUMENTS 3,982,271 A    9/1976  Olivieri et al.
6,714,414 B1   3/2004  Dubovsky et al.
(Continued)

FOREIGN PATENT DOCUMENTS

CN    201310831 Y    9/2009
JP    S5352070 A     5/1978
(Continued)

OTHER PUBLICATIONS

English translation of CN201310831, Rao, Sep. 16, 2009.*

*Primary Examiner* — Evan Dzierzynski
(74) *Attorney, Agent, or Firm* — Akarsh P. Belagodu

(57) ABSTRACT

A LED module comprising at least one LED mounted on a thermo-conducting flat substrate, said LED module being adapted for being used together with a TIM and a heat sink, said thermo-conducting flat substrate being adapted for spreading heat from said LED module through said TIM to said heat sink, said thermo-conducting flat substrate comprising a plurality of fastener eyes, each of said fastener eyes being adopted for receiving a fastener such as a screw or a rivet for mounting said thermo-conducting flat substrate to said heat sink, wherein said thermo-conducting flat substrate comprises integrally formed deformable zones in vicinity of (Continued)

each of said plurality of fastener eyes, said integrally formed deformable zones being coherent with said thermo-conducting flat substrate.

12 Claims, 3 Drawing Sheets

(51) Int. Cl.
- *H05K 3/00* (2006.01)
- *F21V 17/10* (2006.01)
- *F21V 17/12* (2006.01)
- *F21V 29/00* (2015.01)
- *F21Y 115/10* (2016.01)

(52) U.S. Cl.
CPC ....... *F21V 19/0055* (2013.01); *H05K 3/0061* (2013.01); *F21V 29/2212* (2013.01); *F21Y 2115/10* (2016.08); *H05K 2201/10106* (2013.01); *H05K 2201/10409* (2013.01)

(56) References Cited

U.S. PATENT DOCUMENTS

| | | | |
|---|---|---|---|
| 6,814,584 B2* | 11/2004 | Zaderej | H01R 13/2414 439/66 |
| 7,988,336 B1 | 8/2011 | Harbers et al. | |
| 2005/0128744 A1* | 6/2005 | You | F21V 7/0083 362/241 |
| 2006/0198110 A1 | 9/2006 | Hunkeler et al. | |
| 2007/0102142 A1 | 5/2007 | Reis et al. | |
| 2008/0158822 A1 | 7/2008 | Stolze et al. | |
| 2009/0097249 A1* | 4/2009 | Lee | F21K 9/00 362/249.02 |
| 2009/0290345 A1* | 11/2009 | Shaner | F21K 9/00 362/249.01 |
| 2010/0006871 A1* | 1/2010 | Imai | F21K 9/13 257/89 |
| 2010/0259919 A1* | 10/2010 | Khazi | F21S 8/026 362/84 |
| 2010/0302777 A1* | 12/2010 | Knoll | F21V 17/06 362/235 |
| 2011/0089805 A1 | 4/2011 | Betsuda et al. | |
| 2011/0317437 A1 | 12/2011 | Chang | |

FOREIGN PATENT DOCUMENTS

| | | |
|---|---|---|
| JP | S57192053 A | 11/1982 |
| JP | H051285 A | 1/1993 |
| JP | 7202088 A | 8/1995 |
| JP | 2003243584 A | 8/2003 |
| JP | 2009140718 A | 6/2009 |
| JP | 2010177404 A | 8/2010 |
| JP | 2011150815 A | 8/2011 |

* cited by examiner

LED MODULE AND LUMINAIRE COMPRISING SAID MODULE

CROSS-REFERENCE TO PRIOR APPLICATIONS

This application is the U.S. National Phase application under 35 U.S.C. § 371 of International Application No. PCT/IB313/050423, filed on Jan. 17, 2013, which claims the benefit of U.S. Provisional Patent Application No. 61/590, 351, filed on Jan. 25, 2012. These applications are hereby incorporated by reference herein.

FIELD OF THE INVENTION

The present invention relates to an LED module, and in particular an LED module having deformable zones in vicinity of screw holes for receiving a screw for mounting the LED module to a heat sink.

BACKGROUND OF THE INVENTION

Nowadays many LED-driven luminaires and systems are on the market. Many of these systems are equipped with LED modules.

In most such applications, the LED modules are fixed against a metal mounting surface of the system or the luminaire. When used, LED modules generate heat in addition to light. In order to ensure a long service life of the LED module, it is important to lead away the generated heat. Typically, the generated heat is lead to the metal mounting surface of the system or the luminaire and then to the surroundings. This metal mounting surface thus functions as a heat sink.

It is important to ensure good thermal contact between the LED module and the heat sink. US 20080158822 A1 discloses a power semiconductor module comprising a heat-dissipation contact area configured to thermally connect the power semiconductor module to a heat sink. In order to further improve the thermal contact, the power semiconductor module also comprises a housing and a press-on element. The press-on element comprises an anchoring region and is captively anchored in the housing. A fixing eye is resiliently coupled with the anchoring region.

There appears to be room for improvement of the technology disclosed in US 20080158822 A1. The manufacturing of a module comprising several elements where one is anchored in the other is complicated. As the press-on elements are injection-molded into the plastic casing they are made of a material having different thermo-conducting characteristics compared to the plastic casing which could lead to problems.

SUMMARY OF THE INVENTION

It is an object of the present invention to overcome this problem, and to provide an improved LED module comprising at least one LED mounted on a thermo-conducting flat substrate. In particular, it is an object of the present invention to provide an LED module facilitating heat transport from heat-generating LEDs to a heat sink.

According to a first aspect of the invention, this and other objects are achieved by providing a LED module comprising at least one LED mounted on a thermo-conducting flat substrate, said LED module being adapted for being used together with a thermal interface material (TIM) and a heat sink, said thermo-conducting flat substrate being adapted for spreading heat from said LED module through said TIM to said heat sink, said thermo-conducting flat substrate comprising a plurality of fastener eyes, each of said fastener eyes being adopted for receiving a fastener for mounting said thermo-conducting flat substrate to said heat sink, wherein said thermo-conducting flat substrate comprises integrally formed deformable zones in vicinity of each of said plurality of fastener eyes, said integrally formed deformable zones being coherent with said thermo-conducting flat substrate.

The term "fastener" is intended to comprise any suitable fastener such as a screw or a rivet. Similarly, the term "fastener eye" is intended to comprise screw eyes as well as rivet eyes.

The thermo-conducting flat substrate may in one embodiment a printed circuit board and that the LED module is a LED printed circuit board (pcb). This embodiment is advantageous when the LED module generates a low amount of heat.

In another embodiment, the thermo-conducting flat substrate is a heat spreader onto which a LED pcb has been joined. It is advantageous that the heat spreader is a sheet metal heat spreader typically having a maximum thickness of 4 mm. Typically, the heat spreader is made of aluminium.

It is advantageous that the integrally formed deformable zones are thinner and/or less stiff than the rest of the thermo-conducting flat substrate. It is particularly advantageous that the thickness of the integrally formed deformable zone is at most half of the thickness of the rest of the thermo-conducting flat substrate.

According to a second aspect, the object of the invention is achieved by providing a LED unit comprising a LED module according to the first aspect and a heat sink, wherein the LED module is attached to said heat sink by applying fasteners such as screws or rivets through said fastener eyes (such as screw eyes or rivet eyes) into corresponding fastener holes (such as screw holes or rivet holes) in the heat sink.

It is advantageous that a TIM is arranged between the thermo-conducting flat substrate of the LED module and the heat sink. It is particularly advantageous that the TIM is chosen from the group of a thermal pad, thermal putty, or a thermal paste.

According to a third aspect, the object of the invention is achieved by providing a luminaire comprising a LED module according to the first aspect of the invention or a LED unit according to the second aspect of the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

The present invention as defined in the claims provides a reliable mechanical as well as thermal connection between LED modules and heat sinks such as luminaire casings in combination with thermal pads or high viscous thermal putty as thermal interface material. From a mechanical perspective, a high reliability is achieved when using a thermal pad or a thermal putty as thermal interface material (TIM). The mounting screws can be tightened without special measures or special torque limitations and without the risk of loosing screws as a result of decreasing torque over time. From a thermal perspective, a good thermal contact between the LED module and the heat sink is achieved because of a controlled and limited compressing force at the thermal interface which ensures that the heat spreader stays flat.

Figure 1:
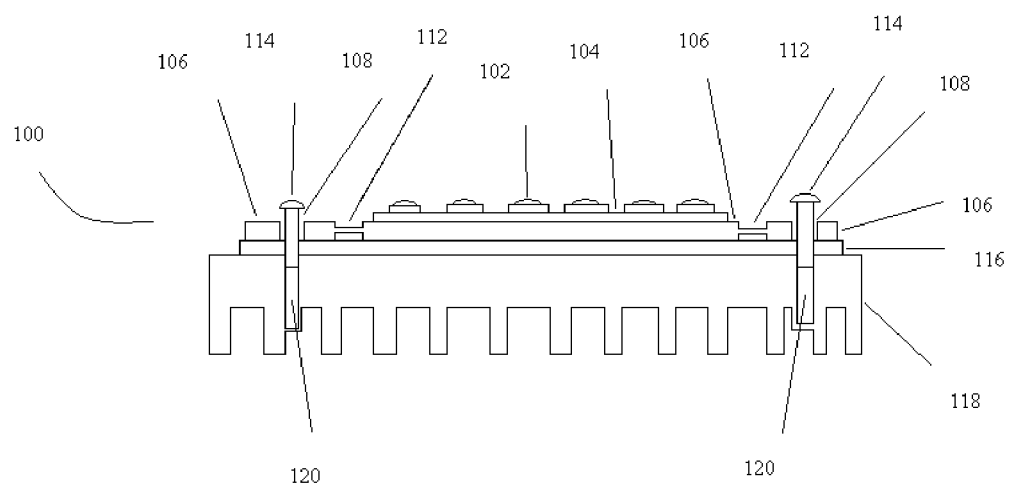
FIG. 1 illustrates a cross-sectional view of a LED module about to be joined to a heat sink.

Referring now to the drawings and to FIG. 1 in particular, there is depicted a cross-sectional view of an LED module about to be joined to a mounting surface functioning as a heat sink 118. The LED module is comprised of a plurality of LEDs 102 mounted on a LED printed circuitry board (LED pcb) 104. In the embodiment shown, the LED pcb 104 is joined to a heat spreader 106, typically made of a metal such as aluminum. However, in case the heat generating capacity of the LEDs of the LED pcb is limited, it is also possible not to include any such separate heat spreader. The special adaptation described below for fastening the heat spreader to the heat sink 118 is then included in the LED pcb. 106. This embodiment is not shown in the figures.

The heat spreader 106 comprises a plurality of screw eyes 108 adapted for receiving a screw 114. Each of the screw eyes 108 is located above a corresponding threaded screw hole 120 in the heat sink 118. In the vicinity of each screw eye 108, there is a deformable zone 112 that is integrally formed in the heat spreader 106. These deformable zones 112 are designed in such a way that they will start deforming when a certain force limit exceeds. Between the heat spreader 106 and the heat sink 118, there is a thermal interface material (TIM) 116.

Figure 2:
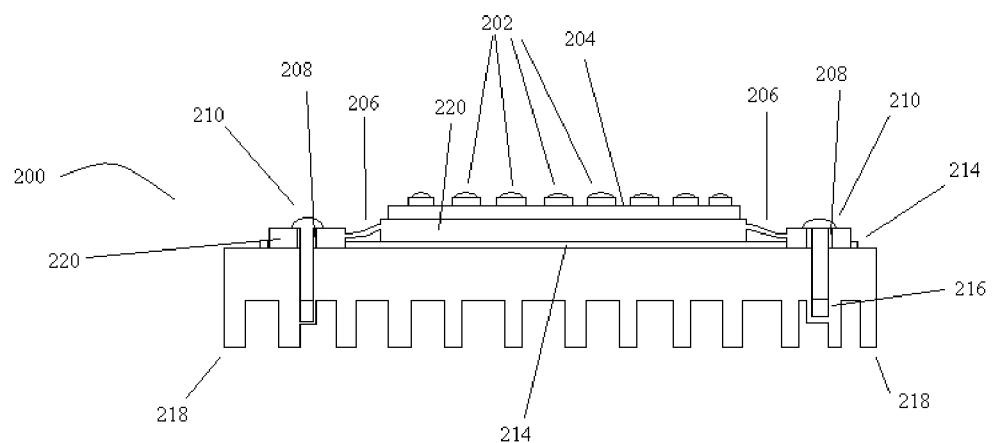
FIG. 2 illustrates a cross-sectional view of a LED module that has been joined to a heat sink.

Referring now to FIG. 2, there is depicted a cross-sectional view of an LED module that has been joined to a mounting surface functioning as a heat sink 218. The LED module is of the same type as in FIG. 1 and is comprised of a plurality of LEDs 202 mounted on a LED pcb 204. The heat spreader 220 comprises a plurality of screw eyes 208 adapted for receiving a screw 210. Each of the screw eyes 208 is located above a corresponding threaded screw hole 216 in the heat sink 218. In the vicinity of each screw eye 208, there is a deformable zone 206 that is integrally formed in the heat spreader 106. Between the heat spreader 220 and the heat sink 218, there is a thermal interface material (TIM) 214. The screws 210 depicted in FIG. 2 have been screwed into the screw holes 216 of the heat sink 218. As a consequence the deformable zones 206 in vicinity of the screw eyes 208 have been deformed and a good thermal contact between the heat spreader 220 and the heat sink 218 via the TIM 214 has been established.

Figure 3:
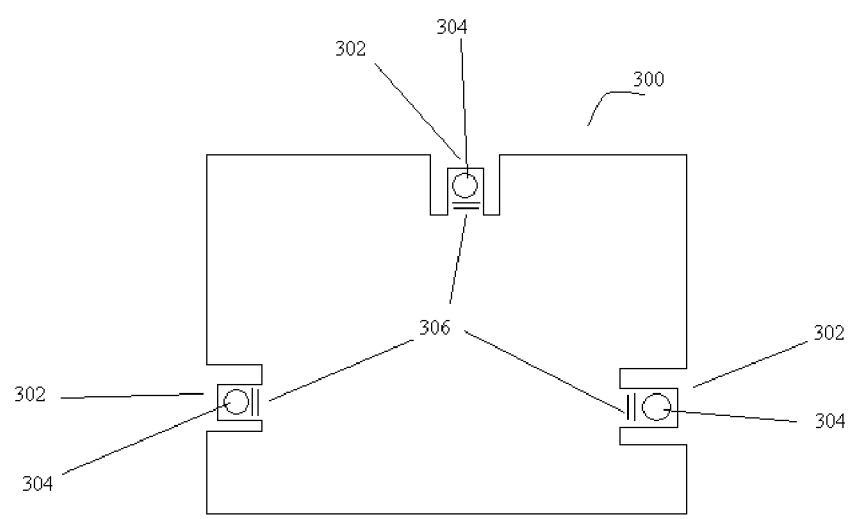
FIG. 3 illustrates a view from above of a heat spreader comprising screw eyes, and where there are integrally formed deformable zones in vicinity of each of said plurality of screw eyes

Referring now to FIG. 3, a heat spreader 300 or a LED pcb (in case the pcb also functions as a heat spreader) is shown having three separate screw eyes 302 comprising screw holes 304 and deformable zones 306.

Experiments regarding tightening of screws joining a heat spreader to a heat sink where the heat spreader and the heat sink is separated by a thermal pad have been carried out. In these experiments, a heat spreader as shown in FIG. 3 was compared to a conventional heat spreader of the same size having regular screw holes and neither screw eyes nor deformable zones. It turned out that the heat spreader in accordance with the present invention stayed flat and that a deformation of the thermal pat was only obtained in vicinity to the screw eyes. In contrast, after a similar amount of tightening the screws joining the conventional heat spreader, that heat spreader bended, and the thermal pad was pressed out at the sides and was generally deformed.

The person skilled in the art realizes that the present invention by no means is limited to the preferred embodiments described above. On the contrary, many modifications and variations are possible within the scope of the appended claims.

The invention claimed is:

1. A LED module comprising:
    at least one LED mounted on a thermo-conducting flat substrate, said LED module being adapted for being used together with a thermal interface material (TIM) and a heat sink,
    said thermo-conducting flat substrate being adapted for spreading heat from said LED module through said TIM to said heat sink, said thermo-conducting flat substrate comprising a plurality of fastener eyes,
    each of said fastener eyes being adapted for receiving a fastener for mounting said thermo-conducting flat substrate to said heat sink,
    wherein said thermo-conducting flat substrate comprises deformable zones in vicinity of each of said plurality of fastener eyes, said deformable zones being integrally formed with said thermo-conducting flat substrate such that the deformable zones and the thermo-conducting flat surface have similar thermo-conducting characteristics, wherein each of said deformable zones are thinner and/or less stiff than the rest of the thermo-conducting flat substrate.

2. The LED module according to claim 1, wherein that the thermo-conducting flat substrate is a printed circuit board and that the LED module is a LED pcb.

3. The LED module according to claim 1, wherein that the thermo-conducting flat substrate is a heat spreader onto which a LED pcb has been joined.

4. The LED module according to claim 3, wherein the heat spreader is a sheet metal heat spreader typically having a maximum thickness of 4 mm.

5. The LED module according to claim 1, wherein the thickness of the integrally formed deformable zone is at most half of the thickness of the rest of the thermo-conducting flat substrate.

6. The LED module according to claim 1, wherein the fastener is a screw or a rivet.

7. The LED unit comprising a LED module according to claim 6 and a heat sink, wherein the LED module is attached to said heat sink by arranging fasteners through said fastener eyes into corresponding fastener holes in the heat sink.

8. The LED unit according to claim 7, where a TIM is arranged between the thermo-conducting flat substrate of the LED module and the heat sink.

9. The LED unit according to claim 8, wherein the TIM is chosen from the group of a thermal pad, thermal putty, or a thermal paste.

10. The LED unit according to claim 7, wherein the fastener is a screw or a rivet.

11. The luminaire comprising a LED module according to claim 6 or a LED unit.

12. The LED unit according to claim 1, wherein the deformable zones are arranged to be deformed in vicinity of the fastener eyes so as to make the heat spreader stay flat when tightening the fastener.

* * * * *